United States Patent [19]

Nomura et al.

[11] 4,352,062

[45] Sep. 28, 1982

[54] DIGITAL DISPLAY TYPE TACHOMETER FOR AN AUTOMOBILE

[75] Inventors: Hiroyuki Nomura, Fujisawa; Teruo Kawasaki; Mikio Takeuchi, both of Yokohama, all of Japan

[73] Assignee: Nissan Motor Co., Ltd., Yokohama, Japan

[21] Appl. No.: 177,630

[22] Filed: Aug. 13, 1980

[30] Foreign Application Priority Data

Aug. 24, 1979 [JP] Japan ............................ 54/107183

[51] Int. Cl.³ .......................... G01P 3/48; G01P 3/54
[52] U.S. Cl. ................................... 324/169; 73/499; 340/670
[58] Field of Search ............... 324/169, 168, 166, 170; 73/499, 518, 117.3; 340/670; 364/565

[56] References Cited

U.S. PATENT DOCUMENTS 4,243,938  1/1981  Bliven et al. ..................... 324/169

OTHER PUBLICATIONS

Wetzel, Electronic Revolution Counter With Easy Readable LED Cube Display, Nov. 1976, pp. 159-161.

*Primary Examiner*—Stanley T. Krawczewicz

*Attorney, Agent, or Firm*—Lane, Aitken, Kice & Kananen

[57] ABSTRACT

A digital display type tachometer for an automobile for numerically displaying a rotation speed of the engine comprises a numeric character display device having display sections for 1000's, 100's, 10's and 1's digits, the 1's digit display section being constructed to display always "0", a counter for counting pulses generated in synchronism with the rotations of the engine to produce a BCD signal depending on the rotation speed, and decoding/driver means for decoding the BCD signal into decimal numeric character signals for 1000's, 100's and 10's digits and driving the 1000's, 100's, and 10's digit display sections by these character signals, respectively. The digital display type tachometer further comprises means for detecting whether the rotation speed of the engine is higher than 1000 rpm and producing a detection signal when the rotation speed is higher than 1000 rpm and means for controlling in response to said detection signal the 10's digit display section to display "0", whereby when the rotation speed of the engine is higher than 1000 rpm the rotation speed of the engine is displayed only with 1000's and 100's digits, while when the rotation speed of the engine is lower than 1000 rpm, the rotation speed is displayed with 100's and 10's digits.

6 Claims, 3 Drawing Figures

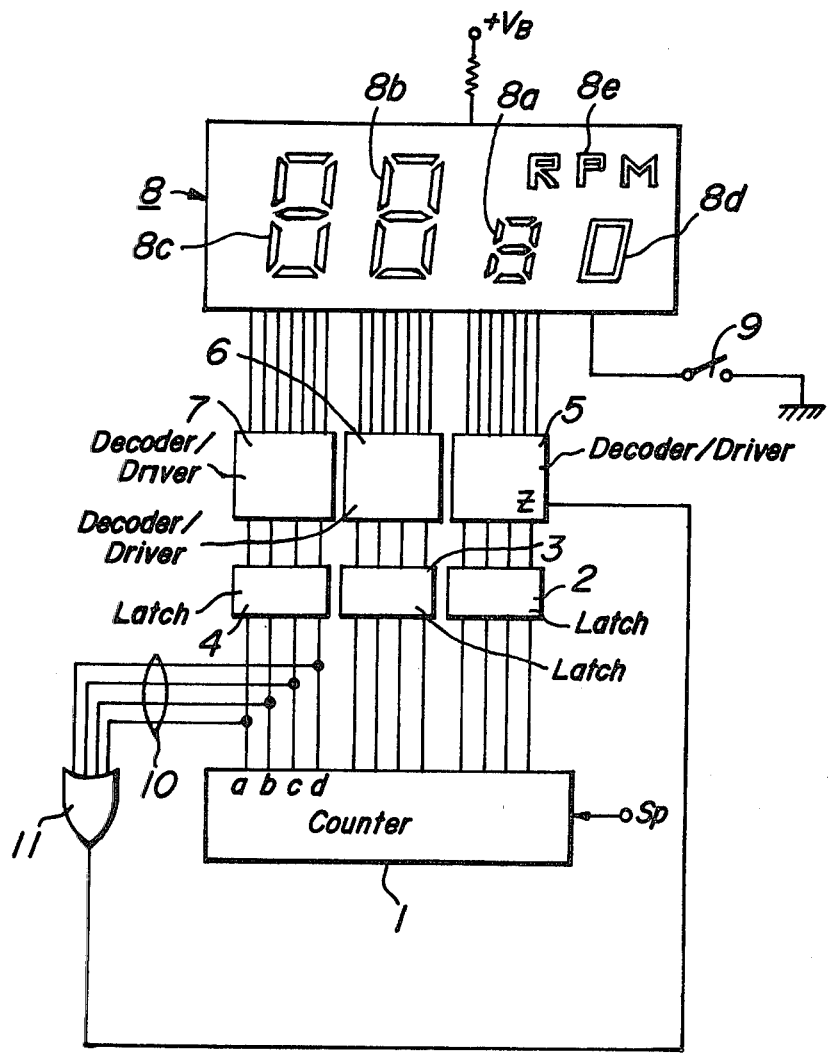

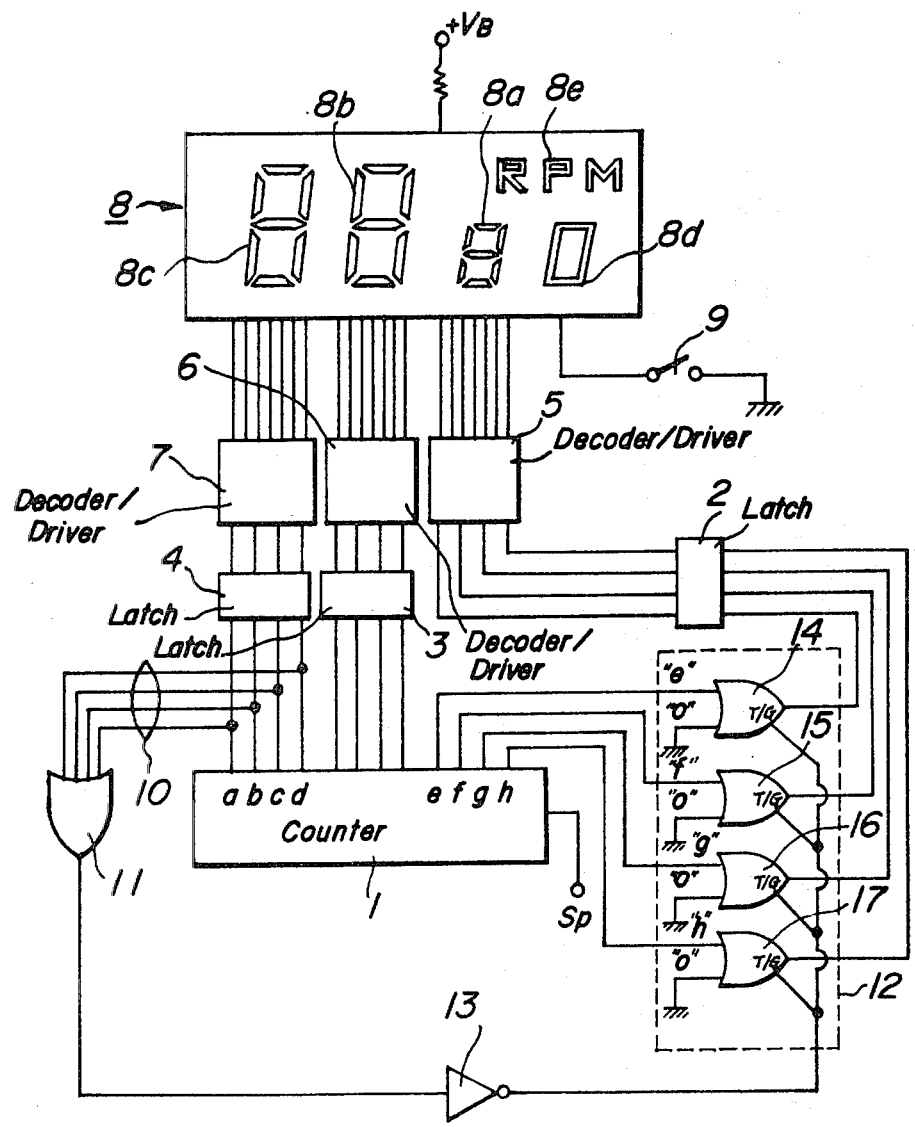

DIGITAL DISPLAY TYPE TACHOMETER FOR AN AUTOMOBILE

BACKGROUND OF THE INVENTION

The invention relates to a digital display type tachometer for automobiles for numerically displaying a rotation speed of the engine.

Recently, a pointer type tachometer in automobiles tends to be replaced by a digital display type tachometer for numerically displaying a rotation speed of the engine.

An embodiment of the known digital display type tachometers is shown in FIG. 1, in which a counter 1 counts the number of angle pulses Sp per unit time, which pulses are generated from a crank angle sensor (not shown) depending on a rotation speed of the engine, to produce BCD (Binary Coded Decimal) signals of 1000's, 100's and 10's digits depending on the rotation speed of the engine.

The BCD signals are then latched by latch circuits 2, 3 and 4 at a predetermined timing respectively and converted into decimal character signals by decoder/driver circuits 5, 6 and 7 which character signals in turn are applied to a digital display device 8 having display sections 8a, 8b and 8c for the 1000's, 100's and 10's digits, each comprising seven segments to numerically display the rotation speed of the engine.

A display section 8d for the 1's digit is constructed to display always "zero" and is driven together with a display section 8e for "RPM" by closing an ignition switch 9.

In general, during normal driving it is superfluous to display a 10's digit of the engine rotation speed and it is sufficient to indicate the 100's and 1000's digits only.

However, in the known digital display type tachometer as shown in FIG. 1, since the display section 8a for the 10's digit is always driven, the indication on the 10's digit display section 8a varies unsteadily according to the slight variation of the engine rotation speed in driving the automobile which annoys the driver.

On the other hand, in the idling condition in which the rotation speed of the engine is between 500 and 700 rpm, it is desired to display the 10's digit in addition to the 100's digit. For example, when a heavy load such as an air conditioner and the like is loaded on the engine, the idling engine speed must be finely adjusted to a suitable speed higher than the normal idling engine speed, and for this purpose it is necessary to display a precise indication including the 10's digit.

SUMMARY OF THE INVENTION

Accordingly, the object of the invention is to provide a digital display type tachometer for a vehicle in which when, the rotation speed of the engine is higher than 1000 rpm, the rotation speed is displayed only with digits not less than the 100's digit while fixing the indication of the 10's digit at "zero", while when the rotation speed of the engine is lower than 1000 rpm, the rotation speed is displayed with digits including the 10's digit.

According to the present invention there is provided a digital display type tachometer for an automobile for numerically displaying a rotation speed of the engine, comprising:

digital display means comprising display sections for 1000's, 100's, 10's, and 1's digits, the 1's digit display section being constructed to display always "zero";

means for counting pulses generated in synchronism with the rotation of the engine to provide a digital signal depending on the rotation speed of the engine;

means for converting the digital signal from said counting means into decimal character signals of 1000's, 100's and 10's digits of the rotation speed and supplying these character signals to said 1000's, 100's and 10's digit display sections;

means for detecting whether the rotation speed of the engine is higher or lower than 1000 rpm and producing a detection signal when the rotation speed of the engine is higher than 1000 rpm; and means for controlling in response to said detection signal the 10's digit display section to display "zero".

BRIEF DESCRIPTION OF THE DRAWINGS

FIGS. 2 and 3 are block diagrams of first and second embodiment of the digital display type tachometer according to the invention.

DETAILED DESCRIPTION OF THE PREFERRED EMBODIMENT

Figure 1:
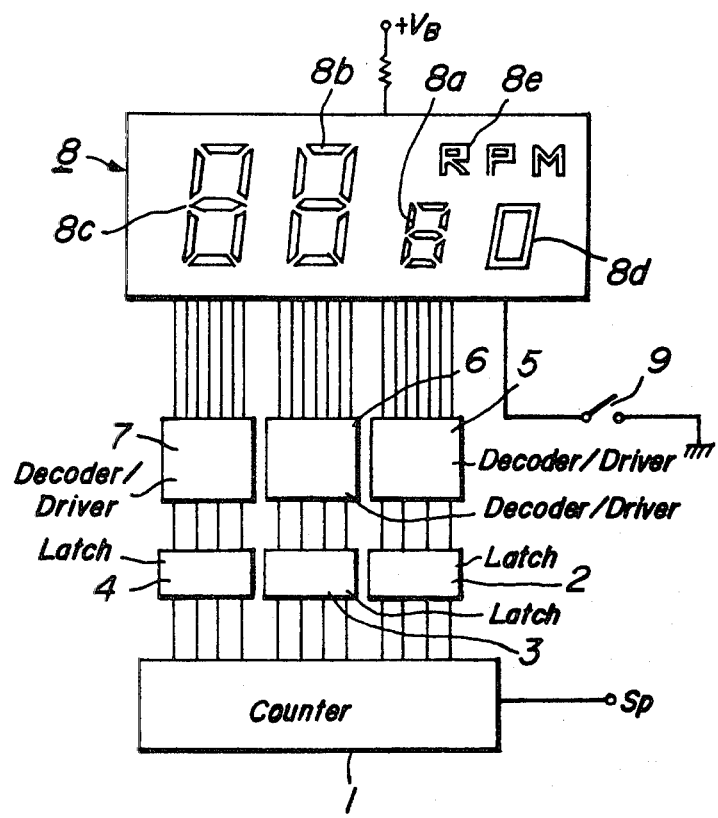
FIG. 1 is a block diagram illustrating an embodiment of the known digital display type tachometer.

Referring to FIG. 2 there is shown in block diagram one embodiment of the digital display type tachometer according to the invention. Components in FIG. 2 which correspond to components in FIG. 1 have been given the same reference numerals.

In this embodiment, the decoder/driver circuit 5 for the 10's digit is provided with a terminal Z for zero displaying which causes the display section 8a to display "zero" independently of the BCD signal of the 10's digit from the latch circuit 2 when the terminal Z is at "1". When the terminal Z is at "0", any one of the numerals "0", "1", . . . "9" is displayed according to the BCD signal of 10's digit from the latch circuit 2.

To the terminal Z of the decoder/driver circuit 5 are supplied all of four bit signals a, b, c, d of the BCD signal of the 1000's digit of the counter 1 through signal lines 10 and an OR circuit 11. The decoder/driver circuit 5, the signal lines 10 and the OR circuit 11 constitute a detection circuit for detecting whether the rotation speed of the engine is higher or lower than 1000 rpm and control circuit for the displaying the 10's digit.

The operation of the digital display type tachometer described above is as follows. On the one hand, when the rotation speed of the engine is higher than 1000 rpm, at least one of the bits a, b, c, d in the BCD signal of the 1000's digit of the counter 1 becomes a binary "1", and hence the output signal of the OR circuit 11 becomes a binary "1" which is applied to the terminal Z of the decoder/driver circuit 5. As a result of this, the decoder/driver circuit 5 produces a character signal for dislaying "zero" on the 10's digit display section 8a independently of the BCD signal of the 10's digit latched in the latch circuit 2.

On the other hand, when the rotation speed of the engine is lower than 1000 rpm, all of the four bits a, b, c, d of the BCD signal of the 1000's digit become a logical "0" and hence the output signal of the OR circuit 11 also becomes a logical "0" which is applied to the terminal Z of the decoder/driver circuit 5. Then, the decoder/driver circuit 5 produces a decimal character signal according to the BCD signal of the 10's digit latched in the latch circuit 2 so that the 10's digit of the rotation speed is displayed on the 10's digit display section 8a.

Thus, when the rotation speed of the engine is higher than 1000 rpm the rotation speed is displayed on the digital display device 8 only with digits higher than the 10's digit, that is, only with 1000's and 100's digits, while when the rotation speed of the engine is lower than 1000 rpm, the rotation speed is displayed on the digital display device 8 with digits higher than the 1's digit, that is with 100's and 10's digits as significant digits.

Referring to FIG. 3, there is shown another embodiment according to the invention in which use is made of a conventional IC without a terminal Z for zero displaying as described above as the decoder/driver circuit 5. Corresponding components in FIG. 3 has been given the same reference numerals as in FIGS. 1 and 2.

In this embodiment, a changeover circuit 12 is inserted between the 10's digit outputs of the counter 1 and the latch circuit 2. The changeover circuit 12 is controlled by a binary signal obtained by inverting the output signal of the OR circuit 11 by an inverter 13 to supply either the BCD signal comprising four bits e, f, g, h of the 10's digit or a "0000" signal to the latch circuit 2.

The changeover circuit 12 comprises four tri-state buffers 14 to 17, one input of each of which buffers is respectively connected to receive four bits e, f, g, h of the 10's digit BCD signal from the counter 1, respectively, and the other input of each of the buffers are connected to the ground potential corresponding to a binary "0". The outputs of these buffers are connected to the inputs of the latch circuit 2. The timing gate inputs T/G of these buffers are connected to the output of the inverter 3.

When the signal on the timing gate inputs T/G is a binary "1", the tri-state buffers 14 to 17 supply the four bits e, f, g, h of the BCD signal of the 10's digit from the counter 1 to the latch circuit 2, respectively, while when the signal on the timing gate inputs T/G is a binary "0", each of the tri-state buffers 14 to 17 supplies a binary "0" to the latch circuit 2.

Thus, when the rotation speed of the engine is higher than 1000 rpm, the output signal of the OR circuit 11 is a binary "1" and the output signal of the inverter 13 is a binary "0", so that the "0000" signal is supplied to the latch circuit 2 and the 10's digit display section 8a displays "0". When the rotation speed of the engine is lower than 1000 rpm, the output signal of the OR circuit 11 is "0", and the output signal of the inverter 13 is "1", so that the BCD signal comprising four bits e, f, g, h of the 10's digit of the counter 1 is applied to the latch circuit 2 and the 10's digit display section 8a displays a 10's digit 0 to 9 of the rotation speed according to the latched BCD signal of the 10's digit.

Although the invention has been described with reference to specific embodiments, the invention is not limited to these embodiment and many modifications can be conceived by those skilled in the art within the scope of the invention. For example, although in the above-mentioned embodiments the BCD signal of 1000's digit of the counter 1 is used to detect whether the rotation speed of the engine is higher or lower than 1000 rpm, a separate circuit for discriminating whether the rotation speed of engine is higher or lower than 1000 rpm may be used to control the 10's digit displaying in the above manner.

Further, although in the abovementioned embodiments a digital display device comprising a fluorescent numerical display tube is used, other digital display devices comprising light emitting diodes, liquid crystal elements, electrochromic elements and the like may be used.

As stated hereinbefore, in the digital display type tachometer according to this invention, when the rotation speed of the engine is higher than 1000 rpm, the 10's digit display section in the digital display device displays, "0" and when the rotation speed of the engine is lower than 1000 rpm, the 10's digit display section displays a 10's digit of the rotation speed, whereby during the normal driving the annoying variation of the indication on the 10's digit display section is not produced and in the idling condition a precise indication including 10's digit is displayed which is convenient for adjusting the idling engine speed.

What is claimed is:

1. A digital display type tachometer for an automobile for numerically displaying a rotation speed of the engine, comprising:
   digital display means comprising display sections for 1000's, 100's, 10's and 1's digits, the 1's digit display section being constructed to display always "zero";
   means for counting pulses generated in synchronism with the rotation of the engine to provide a digital signal depending on the rotation speed of the engine;
   means for converting the digital signal from said counting means into decimal character signals of 1000's, 100's and 10's digits of the rotation speed and supplying these character signals to said 1000's, 100's and 10's digit display sections;
   means for detecting whether the rotation speed of the engine is higher or lower than 1000 rpm and producing a detection signal when the rotation speed of the engine is higher than 1000 rpm; and
   means for controlling in response to said detection signal the 10's digit display section to display "zero".

2. A digital display tachometer as claimed in claim 1, wherein said display sections for 1000's 100's and 10's digits in said digital display means each comprises seven segments for displaying decimal characters "0", "1" . . . , "9", said counting means comprises a counter for producing BCD (Binary Coded Decimal) signals of 1000's, 100's and 10's digits depending on the rotation speed of the engine and said converting means comprises decoder/driver circuits for converting said BCD signals of 1000's, 100's and 10's digits into decimal character signals of 1000's, 100's and 10's digits of the rotation speed of the engine, respectively and supplying these character signals to said 1000's, 100's and 10's digit display sections, respectively.

3. A digital display type tachometer as claimed in claim 2, wherein said detecting means comprises an OR circuit for receiving all of four bits of the BCD signal of 1000's digit of said counter to produce the detection signal in the form of a binary signal when the rotation speed of the engine exceeds the 1000 rpm.

4. A digital display type tachometer as claimed in claims 2 or 3, wherein said controlling means comprises said decoder/driver circuit for the BCD signal of the 10's digit which is provided with a terminal for zero displaying, to which terminal is applied said detecting signal, whereby when the rotation speed of the engine is higher than 1000 rpm, said decoder/driver circuit provides a decimal character signal representing "zero" independently of the input BCD signal of the 10's digit, and when the rotation speed of the engine is lower than 1000 rpm, said decoder/driver circuit provides a decimal character signal according to the input BCD signal of the 10's digit.

5. A digital display type tachometer as claimed in claims 2 or 3, wherein said controlling means comprises a changeover circuit which is connected between the 10's digit output of said counter and the decoder/driver circuit for the BCD signal of the 10's digit and is controlled by said detection signal to supply a BCD signal corresponding to zero to the decoder/driver circuit for the 10's digit when the rotation speed is higher than 1000 rpm and to supply the BCD signal of the 10's digit from said counter to the decoder/driver circuit for 10's digit when the rotation speed of the engine is lower than 1000 rpm.

6. A digital display type tachometer as claimed in claim 5, said changeover circuit comprises four tri-state buffers each having first and second inputs, a timing gate input and an output, the first inputs of these buffers being connected to receive four bits of the BCD signal of 10's digit from the counter, respectively, the second inputs of these buffers being connected to a reference potential corresponding to binary "0", the timing gate inputs of these buffers being connected to receive said detection signal, and said outputs of these buffers being connected to the decoder/driver circuit for the 10's digit, whereby when the rotation speed of the engine is higher than 1000 rpm, said tri-state buffers each supplies binary "0" to the decoder/driver circuit for the 10's digit, while when the rotation speed of the engine is lower than 1000 rpm said tri-state buffers supply the four bits of the BCD signal of 10's digit from the counter to the decoder/driver for the 10's digit.

* * * * *